(12) United States Patent
Soer et al.

(10) Patent No.: US 11,788,690 B2
(45) Date of Patent: *Oct. 17, 2023

(54) LIGHT EMITTING DEVICE WITH IMPROVED WARM-WHITE COLOR POINT

(71) Applicant: LUMILEDS LLC, San Jose, CA (US)

(72) Inventors: Wouter Soer, Eindhoven (NL); Hans-Helmut Bechtel, Roetgen (DE)

(73) Assignee: Lumileds LLC, San Jose, CA (US)

( * ) Notice: Subject to any disclaimer, the term of this patent is extended or adjusted under 35 U.S.C. 154(b) by 11 days.

This patent is subject to a terminal disclaimer.

(21) Appl. No.: 17/580,166

(22) Filed: Jan. 20, 2022

(65) Prior Publication Data

US 2022/0146058 A1 May 12, 2022

Related U.S. Application Data

(63) Continuation of application No. 17/064,487, filed on Oct. 6, 2020, now Pat. No. 11,231,148, which is a (Continued)

(30) Foreign Application Priority Data

Jan. 10, 2018 (EP) ...................................... 8151002

(51) Int. Cl.
*F21V 9/00* (2018.01)
*F21K 9/64* (2016.01)
(Continued)

(52) U.S. Cl.
CPC ............ *F21K 9/64* (2016.08); *C09K 11/0883* (2013.01); *C09K 11/77347* (2021.01);
(Continued)

(58) Field of Classification Search
None
See application file for complete search history.

(56) References Cited

U.S. PATENT DOCUMENTS 5,813,753 A 9/1998 Vriens et al.
5,851,063 A * 12/1998 Doughty ............ H01L 25/0753
362/800

(Continued)

FOREIGN PATENT DOCUMENTS

JP 2001-501380 A 1/2001
JP 2003133595 A 5/2003
(Continued)

OTHER PUBLICATIONS

Extended European Search Report corresponding to EP 18782861, dated Jun. 21, 2018, 8 pages.
(Continued)

*Primary Examiner* — Ali Naraghi

(57) ABSTRACT

A light emitting device is disclosed and includes an emission source configured to emit a primary blue light and a wavelength-converting element configured to convert the primary blue light to a secondary light, where the wavelength-converting element including a red phosphor material having a peak emission wavelength that is less than 620 nm and a green phosphor material having a peak emission wavelength that is greater than 530 nm. The device may have a correlated color temperature (CCT) in the range of 1600K-2500K, may exhibit a melanopic/photopic ratio less than 0.25 and/or may exhibit a radiometric power fraction of light having a wavelength below 530 nm below 0.1.

20 Claims, 11 Drawing Sheets

Related U.S. Application Data continuation of application No. 16/140,012, filed on Sep. 24, 2018, now Pat. No. 10,837,607.

(60) Provisional application No. 62/563,483, filed on Sep. 26, 2017.

(51) Int. Cl.

| | |
|---|---|
| *H01L 25/075* | (2006.01) |
| *H01L 33/50* | (2010.01) |
| *C09K 11/08* | (2006.01) |
| *F21V 23/00* | (2015.01) |
| *F21V 7/22* | (2018.01) |
| *F21K 9/62* | (2016.01) |
| *C09K 11/77* | (2006.01) |

(52) U.S. Cl.
CPC .......... *C09K 11/77348* (2021.01); *F21K 9/62* (2016.08); *F21V 7/22* (2013.01); *F21V 23/009* (2013.01); *H01L 25/0753* (2013.01); *H01L 33/504* (2013.01); *H01L 33/507* (2013.01)

(56) References Cited

U.S. PATENT DOCUMENTS

| | | | |
|---|---|---|---|
| 8,643,038 B2* | 2/2014 | Collins | C09K 11/77348 |
| | | | 252/301.36 |
| 9,082,946 B2 | 7/2015 | Vdovin et al. | |
| 9,257,607 B2 | 2/2016 | Schmidt et al. | |
| 9,328,880 B2 | 5/2016 | Harbers | |
| 9,581,300 B2 | 2/2017 | Harbers et al. | |
| 10,014,452 B2 | 7/2018 | Pickett et al. | |
| 10,837,607 B2 | 11/2020 | Soer et al. | |
| 11,231,148 B2* | 1/2022 | Soer | F21K 9/62 |
| 2004/0061124 A1* | 4/2004 | Trottier | H01L 33/44 |
| | | | 257/103 |
| 2006/0022582 A1 | 2/2006 | Radkov | |
| 2010/0045168 A1* | 2/2010 | Su | H01L 33/504 |
| | | | 313/503 |
| 2011/0279016 A1* | 11/2011 | Li | H01L 33/502 |
| | | | 313/503 |
| 2013/0082289 A1 | 4/2013 | Saduta et al. | |
| 2015/0226386 A1* | 8/2015 | Seshadri | F21K 9/64 |
| | | | 362/84 |
| 2015/0334789 A1 | 11/2015 | van de Ven et al. | |
| 2017/0348506 A1 | 12/2017 | Berman et al. | |
| 2018/0073689 A1 | 3/2018 | Soer et al. | |
| 2021/0018152 A1 | 1/2021 | Soer et al. | |

FOREIGN PATENT DOCUMENTS

| | | |
|---|---|---|
| JP | 2010-277952 A | 12/2010 |
| JP | 2013207241 A | 10/2013 |
| JP | 2014-515863 A | 7/2014 |
| JP | 2017050524 A | 3/2017 |
| TW | 201036214 A | 10/2010 |
| TW | 201537111 A | 10/2015 |
| TW | 201621218 A | 6/2016 |
| WO | 2017/073815 A1 | 5/2017 |
| WO | 2017/106759 A1 | 6/2017 |

OTHER PUBLICATIONS

From the EPO as the ISA, Notification of Transmittal of the International Search Report and Written Opinion, PCT/US2018/052630, dated Dec. 19, 2018, 14 pages.

* cited by examiner

LIGHT EMITTING DEVICE WITH IMPROVED WARM-WHITE COLOR POINT

CROSS-REFERENCE TO RELATED APPLICATIONS

The present application is a continuation application of U.S. patent application Ser. No. 17/064,487 filed on Oct. 6, 2020, which was a continuation application of U.S. patent application Ser. No. 16/140,012, titled "LIGHT EMITTING DEVICE WITH IMPROVED WARM-WHITE COLOR POINT," filed on Sep. 24, 2018, which claims benefit of priority to U.S. Provisional Patent Application No. 62/563,483, filed on Sep. 26, 2017.

BACKGROUND

Light emitting diodes ("LEDs") are commonly used as light sources in various applications. LEDs are more energy-efficient than traditional light sources, providing higher energy conversion efficiency than incandescent lamps and fluorescent light, for example. Furthermore, LEDs radiate less heat into illuminated regions and afford a greater breadth of control over brightness, emission color and spectrum than traditional light sources. These characteristics make LEDs a viable choice for various outdoor lighting applications ranging from street lighting to traffic lights and street signage.

SUMMARY

According to aspects of the disclosure, a light emitting device is disclosed and includes an emission source configured to emit a primary blue light, and a wavelength-converting element configured to convert the primary blue light to a secondary light having a correlated color temperature (CCT) in the range of 1600K-2500K, a melanopic/photopic ratio of less than 0.25, and a color rendering index (CRI) in the range of 40-60. The wavelength-converting element includes a red phosphor material having a peak emission wavelength that is less than 620 nm and a green phosphor material having a peak emission wavelength that is greater than 530 nm.

According to aspects of the disclosure, a light emitting device is disclosed and includes an emission source configured to emit a primary blue light, and a wavelength-converting element configured to convert the primary blue light to a secondary light having a correlated color temperature (CCT) in the range of 1600K-2500K, a radiometric power fraction of light having a wavelength below 530 nm is below 0.1, and a color rendering index (CRI) in the range of 40-60. The wavelength-converting element includes a red phosphor material having a peak emission wavelength that is less than 620 nm and a green phosphor material having a peak emission wavelength that is greater than 530 nm.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

Figure 1A:
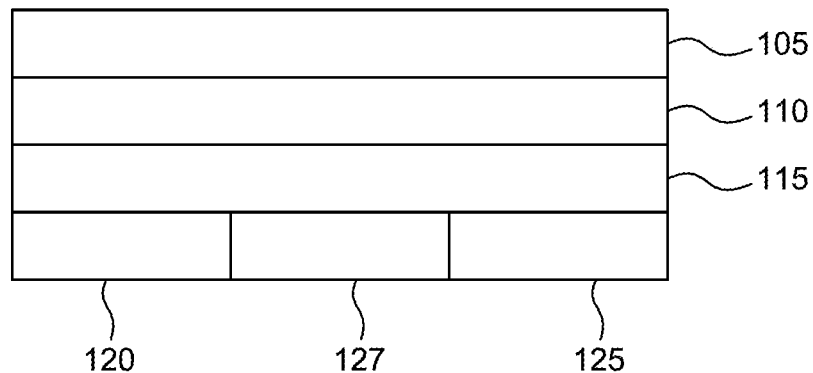
FIG. 1A is a diagram of an example light emitting element (LEE) that includes a light emitting semiconductor structure and a porous structure.

Outdoor lighting applications may use high-pressure sodium (HPS) light sources, which provide light emissions having a correlated color temperature (CCT) in the range of 1900-2800 K. By contrast, LEDs that are typically used in outdoor applications may have a CCT of about 4000K and CRI of about 70. As existing HPS installations are converted to LED, the typical 4000K/70 LED spectrum may become non-optimal due to the relatively high short-wavelength (blue) spectral content. While 3000K/70 LED spectra may offer a reasonable compromise between reduced blue light content, color visibility, and efficacy, some applications require even lower CCTs of around 2000K. For example, light sources having a CCT of around 2000K may be required for preservation of the HPS "look" in historic districts, or for minimization of blue light in areas that are particularly sensitive from an ecological standpoint.

According to aspects of the disclosure, a light emitting device is disclosed that closely matches the emission spectrum of HPS light sources. The light emitting device includes a blue light LED as its primary emission source and a wavelength-converting element that is formed by using an improved warm-white phosphor system (hereinafter "the warm-white phosphor system"). The warm-white phosphor system may be characterized by a combination of a green phosphor and a red phosphor. The green phosphor may have a peak emission wavelength above 530 nm. The red phosphor may have a peak emission wavelength below 620 nm. The warm-white phosphor system is discussed in detail further herein.

According to some implementations, the light emitting device may provide light emissions having a CCT between 1600K and 2500K, which have a reduced blue light content. For example, the emissions may have less than 10% (0.1) radiometric spectral power in wavelengths below 530 nm and/or a melanopic/photopic ratio of less than 0.25. The color fidelity of the emissions may be characterized by a CRI Ra that is greater than 40 or TM-30 Rf that is greater than 40. Accordingly, the light emitting device may have an emission spectrum that is similar and/or superior to that of HPS light sources.

These performance characteristics of the light emitting device are made possible by the improved warm-white phosphor system that is used to make the device's wavelength-converting element. Unlike traditional phosphor systems in illumination-grade warm-white LEDs, the warm-white phosphor system used by the light emitting device does not meet the traditional color rendering requirement of having a CRI that is greater than 70. However, the warm-white phosphor system enables a lower blue light content and higher efficacy that are desirable for many outdoor lighting applications, while still providing better color rendering than HPS light sources. The improved warm-white phosphor system is discussed in detail further below.

Examples of different light emitting devices and/or wavelength-converting element implementations will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only, and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

FIG. 1A is a diagram of an example light emitting element (LEE) 100 that includes a light emitting semiconductor structure 115, a wavelength converting material 110, and an optional coating 105 on the wavelength converting material 110. Contacts 120 and 125 may be coupled to the light emitting semiconductor structure 115, either directly or via another structure such as a submount, for electrical connection to a circuit board or other substrate or device. In embodiments, the contacts 120 and 125 may be electrically insulated from one another by a gap 127, which may be filled with a dielectric material. The light emitting semiconductor structure 115 may be any light emitting semiconductor structure that emits light that may be converted to light having a different color point via a wavelength converting material. For example, the light emitting semiconductor structure 115 may be formed from III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors have indices of refraction ranging from about 2.4 to about 4.1 at the typical emission wavelengths of LEDs in which they are present. For example, III-Nitride semiconductors, such as GaN, have refractive indices of about 2.4 at 500 nm, and III-Phosphide semiconductors, such as InGaP, have refractive indices of about 3.7 at 600 nm. Contacts 120 and 125 may be formed from a solder, such as AuSn, AuGa, AuSi or SAC solders.

Figure 1B:
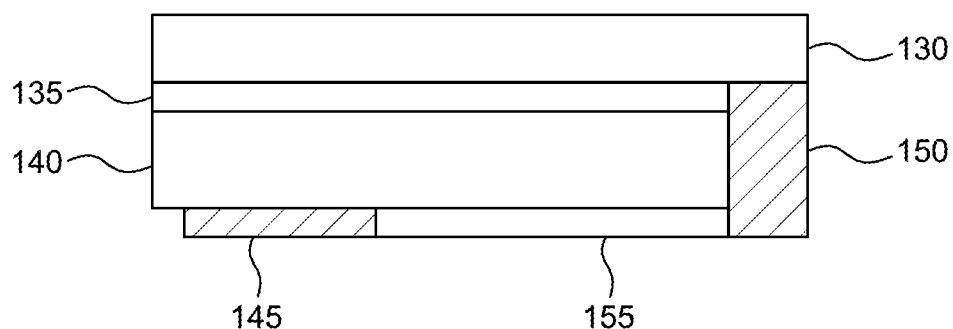
FIG. 1B is a diagram of an example light emitting semiconductor structure that may be included in the LEE of FIG. 1A.

FIG. 1B is a diagram of an example light emitting semiconductor structure 115 that may be included in the LEE 100 of FIG. 1A. The illustrated example is a flip chip structure. However, one of ordinary skill in the art will understand that the embodiments described herein may be applied to other types of LED designs, such as vertical, lateral, and multi junction devices.

In the example illustrated in FIG. 1B, the light emitting semiconductor structure 115 includes a light emitting active region 135 disposed between a semiconductor layer or semiconductor region of n-type conductivity (also referred to as an n-type region) 130 and a semiconductor layer or region of p-type conductivity (also referred to as a p-type region) 140. Contacts 145 and 150 are disposed in contact with a surface of the light emitting semiconductor structure 115, such as a surface of the semiconductor layer or region of p-type conductivity 140, and electrically insulated from one another by a gap 155, which may be filled by a dielectric material, such as an oxide or nitride of silicon (i.e., $SiO_2$ or $Si_3N_4$). In the illustrated embodiment, contact 145 (also referred to as a p-contact) is in direct contact with a surface of the p-type region 140, and the contact 150 (also referred to as an n-contact) is in direct contact with a surface of the n-type region 130. Although not shown in FIG. 1B, a dielectric material, such as disposed in the gap 155, may also line side walls of the light emitting active region 135 and p-type region 140 to electrically insulate those regions from the contact 150 to prevent shorting of the p-n junction.

The n-type region 130 may be grown on a growth substrate and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Like the n-type region 130, the p-type region 140 may include multiple layers of different composition, thickness, and dopant concentrations, including layers that are not intentionally doped, or n-type layers. While layer 130 is described herein as the n-type region and layer 140 is described herein as the p-type region, the n-type and p-type regions could also be switched without departing from the scope of the embodiments described herein.

The light emitting active region 135 may be, for example, a p-n diode junction associated with the interface of p-region 140 and n-region 135. Alternatively, the light emitting active region 135 may include one or more semiconductor layers that are doped n-type or p-type or are un-doped. For example, the light emitting active region 135 may include a single thick or thin light emitting layer. This includes a homojunction, single heterostructure, double heterostructure, or single quantum well structure. Alternatively, the light emitting active region 135 may be a multiple quantum well light emitting region, which may include multiple quantum well light emitting layers separated by barrier layers.

The p-contact 145 may be formed on a surface of the p-type region 140. The p-contact 145 may include multiple conductive layers, such as a reflective metal and a guard metal, which may prevent or reduce electromigration of the reflective metal. The reflective metal may be silver or any other suitable material, and the guard metal may be TiW or TiWN. The n-contact 150 may be formed in contact with a surface of the n-type region 130 in an area where portions of the active region 135, the n-type region 140, and the p-contact 145 have been removed to expose at least a portion of the surface of the n-type region 130. The sidewall of an exposed mesa or via may be coated with a dielectric to prevent shorting. The contacts 145 and 150 may be, for example, metal contacts formed from metals including, but not limited to, gold, silver, nickel, aluminum, titanium, chromium, platinum, palladium, rhodium, rhenium, ruthenium, tungsten, and mixtures or alloys thereof. In other examples, one or both contacts 145 and 150 may be formed from transparent conductors, such as indium tin oxide.

The n-contact 150 and p-contact 145 are not limited to the arrangement illustrated in FIG. 1B and may be arranged in any number of different ways. In embodiments, one or more n-contact vias may be formed in the light emitting semiconductor structure 115 to make electrical contact between the n-contact 150 and the n-type layer 130. Alternatively, the n-contact 150 and p-contact 145 may be redistributed to form bond pads with a dielectric/metal stack as known in the art. The p-contact 145 and the n-contact 150 may be electrically connected to the contacts 120 and 125 of FIG. 1A, respectively, either directly or via another structure, such as a submount.

Referring to FIG. 1A, the wavelength converting material 110 may be any luminescent material, such as a phosphor, phosphor particles in a transparent or translucent binder or matrix, or a ceramic phosphor element, which absorbs light of one wavelength and emits light of a different wavelength. The wavelength converting material 110 may be a ceramic phosphor element such that the ceramic phosphor element may be, for example, a ceramic phosphor plate, such as a platelet of phosphor, for generating one color of light, or a stack of ceramic phosphor platelets for generating different colors of light. The ceramic phosphor plate may have an RI of 1.4 or greater (e.g., 1.7 or greater) at the wavelengths emitted by the light emitting semiconductor structure 115.

The wavelength converting material 110 may be applied in a layer having a thickness that may depend on the wavelength converting material used or other factors related to enhancing the color point shift as a function of drive current as described in more detail below. For example, a layer of wavelength converting material 110 may be approximately 50 μm in thickness while other wavelength converting materials may be formed in layers as thin as 20 μm or as thick as 200 μm. In embodiments, the wavelength converting material 110, such as a ceramic phosphor element, may be pre-formed into a wavelength converting element and attached to the light emitting semiconductor structure 115 using an adhesive or any other method or material known in the art.

In embodiments, the light emitting semiconductor structure 115 may emit blue light. In such embodiments, the wavelength converting material 110 may include, for example, a yellow emitting wavelength converting material or green and red emitting wavelength converting materials, which will produce white light when the light emitted by the respective phosphors combines with the blue light emitted by the light emitting semiconductor structure 115. In other embodiments, the light emitting semiconductor structure 115 emits UV light. In such embodiments, the wavelength converting material 110 may include, for example, blue and yellow wavelength converting materials or blue, green and red wavelength converting materials. Wavelength converting materials emitting other colors of light may be added to tailor the spectrum of light emitted from the device 100.

In embodiments, the wavelength converting material 110 may be composed of $Y_3Al_5O_{12}:Ce^{3+}$. The wavelength converting material 110 may be an amber to red emitting rare earth metal-activated oxonitridoalumosilicate of the general formula $(Ca_{1-x-y-z}Sr_xBa_yMg_z)_{1-n}(Al_{1-a+b}Ba)Si_{1-b}N_{3-b}O_b:RE_n$ wherein $0 \leq x \leq 1$, $0 \leq y \leq 1$, $0 \leq z \leq 1$, $0 \leq a \leq 1$, $0 \leq b \leq 1$ and $0.002 \leq n \leq 0.2$, and RE may be selected from europium(II) and cerium(III). The phosphor in the ceramic phosphor plate may also be an oxido-nitride-silicate of general formula $EA_{2-z}Si_5-aBaN_8-aO_a:Ln_z$, wherein $0 \leq z \leq 1$ and $0 < a < 5$, including at least one element EA selected from the group consisting of Mg, Ca, Sr, Ba and Zn and at least one element B selected from the group consisting of Al, Ga and In, and being activated by a lanthanide (Ln) selected from the group consisting of cerium, europium, terbium, praseodymium and mixtures thereof.

In other embodiments, the wavelength converting material 110 may include aluminum garnet phosphors with the general formula $(Lu_{1-x-y-a-b}Y_xGd_y)_3(Al_{1-z}Ga_z)_5O_{12}:Ce_aPr_b$, wherein $0 < x < 1$, $0 < y < 1$, $0 \leq z \leq 0.1$, $0 < a \leq 0.2$ and $0 \leq b \leq 0.1$, such as $Lu_3Al_5O_{12}:Ce^{3+}$ and $Y_3Al_5O_{12}:Ce^{3+}$, which emits light in the yellow-green range; and $(Sr_{1-x-y}Ba_xCa_y)_{2-z}Si_5-aAla_N8-aO_a:Eu_z$ 2+, wherein $0 \leq a < 5$, $0 \leq x \leq 1$, $0 \leq y \leq 1$, and $0 \leq z \leq 1$ such as $Sr_2Si_5N_8:Eu^{2+}$, which emits light in the red range. Other green, yellow and red emitting phosphors may also be suitable, including $(Sr_{1-a-b}Ca_bBa_c)Si_xN_yO_z:Eu$ 2+; (a=0.002-0.2, b=0.0-0.25, c=0.0-0.25, x=1.5-2.5, y=1.5-2.5, z=1.5-2.5) including, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $Sr_{1-}$ xBaxSiO4:Eu2+; and (Ca1−xSrx)S:Eu2+ wherein 0≤x≤1 including, CaS:Eu2+ and SrS:Eu2+. Other suitable phosphors include, CaAlSiN3:Eu2+,(Sr,Ca)AlSiN3:Eu2+, and (Sr, Ca, Mg, Ba, Zn)(Al, B, In, Ga)(Si, Ge)N3:Eu2+.

In other embodiments, the wavelength conversion material 110 may also have a general formula (Sr1−a−bCab-BacMgdZne)SixNyOz:Eua 2+, wherein 0.002≤a≤0.2, 0.0≤b≤0.25, 0.0≤c≤0.25, 0.0≤d≤0.25, 0.0≤e≤0.25, 1.5≤x≤2.5, 1.5≤y≤2.5 and 1.5≤z≤2.5. The wavelength conversion material may also have a general formula of MmAaBbOoNn:Zz where an element M is one or more bivalent elements, an element A is one or more trivalent elements, an element B is one or more tetravalent elements, O is oxygen that is optional and may not be in the phosphor plate, N is nitrogen, an element Z that is an activator, n=2/3m+a+4/3b-2/3o, wherein m, a, b can all be 1 and o can be 0 and n can be 3. M is one or more elements selected from Mg (magnesium), Ca (calcium), Sr (strontium), Ba (barium) and Zn (zinc), the element A is one or more elements selected from B (boron), Al (aluminum), In (indium) and Ga (gallium), the element B is Si (silicon) and/or Ge (germanium), and the element Z is one or more elements selected from rare earth or transition metals. The element Z is at least one or more elements selected from Eu (europium), Mg (manganese), Sm (samarium) and Ce (cerium). The element A can be Al (aluminum), the element B can be Si (silicon), and the element Z can be Eu (europium).

The wavelength conversion material 110 may also be an Eu2+ activated Sr—SiON having the formula (Sr1−a−bCab-Bac)SixNyOx:Eua, wherein a=0.002-0.2, b=0.0-0.25, c=0.0-0.25, x=1.5-2.5, y=1.5-2.5.

The wavelength conversion material 110 may also be a chemically-altered Ce: YAG (Yttrium Aluminum Garnet) phosphor that is produced by doping the Ce: YAG phosphor with the trivalent ion of praseodymium (Pr). The wavelength conversion material 110 may include a main fluorescent material and a supplemental fluorescent material. The main fluorescent material may be a Ce: YAG phosphor and the supplementary fluorescent material may be europium (Eu) activated strontium sulfide (SrS) phosphor ("Eu:SrS"). The main fluorescence material may also be a Ce: YAG phosphor or any other suitable yellow-emitting phosphor, and the supplementary fluorescent material may also be a mixed ternary crystalline material of calcium sulfide (CaS) and strontium sulfide (SrS) activated with europium ((CaxSr1_x)S:Eu2+). The main fluorescent material may also be a Ce:YAG phosphor or any other suitable yellow-emitting phosphor, and the supplementary fluorescent material may also be a nitrido-silicate doped with europium. The nitrido-silicate supplementary fluorescent material may have the chemical formula (Sr1−x−y−zBaxCay)2Si5N8:Euz 2+ where 0≤x, y≤0.5 and 0≤z≤0.1.

In embodiments, the wavelength conversion material 110 may include strontium-lithium-aluminum: europium (II) ion (SrLiAl3 N4:Eu2+) class (also referred to as SLA), including MLiAl3N4: Eu2+(M=Sr, Ba, Ca, Mg). In a specific embodiment, the luminescent particles may be selected from the following group of luminescent material systems: MLiAl3N4:Eu (M=Sr, Ba, Ca, Mg), M2SiO4:Eu (M=Ba, Sr, Ca), MSe1−xSx:Eu (M=Sr, Ca, Mg), MSr2S4:Eu (M=Sr, Ca), M2SiF6:Mn (M=Na, K, Rb), M2TiF6:Mn (M=Na, K, Rb), MSiAlN3:Eu (M=Ca, Sr), M8Mg(SiO4)4Cl2:Eu (M=Ca, Sr), M3MgSi2O8:Eu (M=Sr, Ba, Ca), MSi2O2N2:Eu (M=Ba, Sr, Ca), M2Si5−xAlxOxN8−x:Eu (M=Sr, Ca, Ba). However, other systems may also be of interest and may be protected by a coating. Also combinations of particles of two or more different luminescent materials may be applied, such as e.g. a green or a yellow luminescent material in combination with a red luminescent material.

In embodiments, the wavelength conversion material 110 may be a blend of any of the above-described phosphors.

Figure 2A:
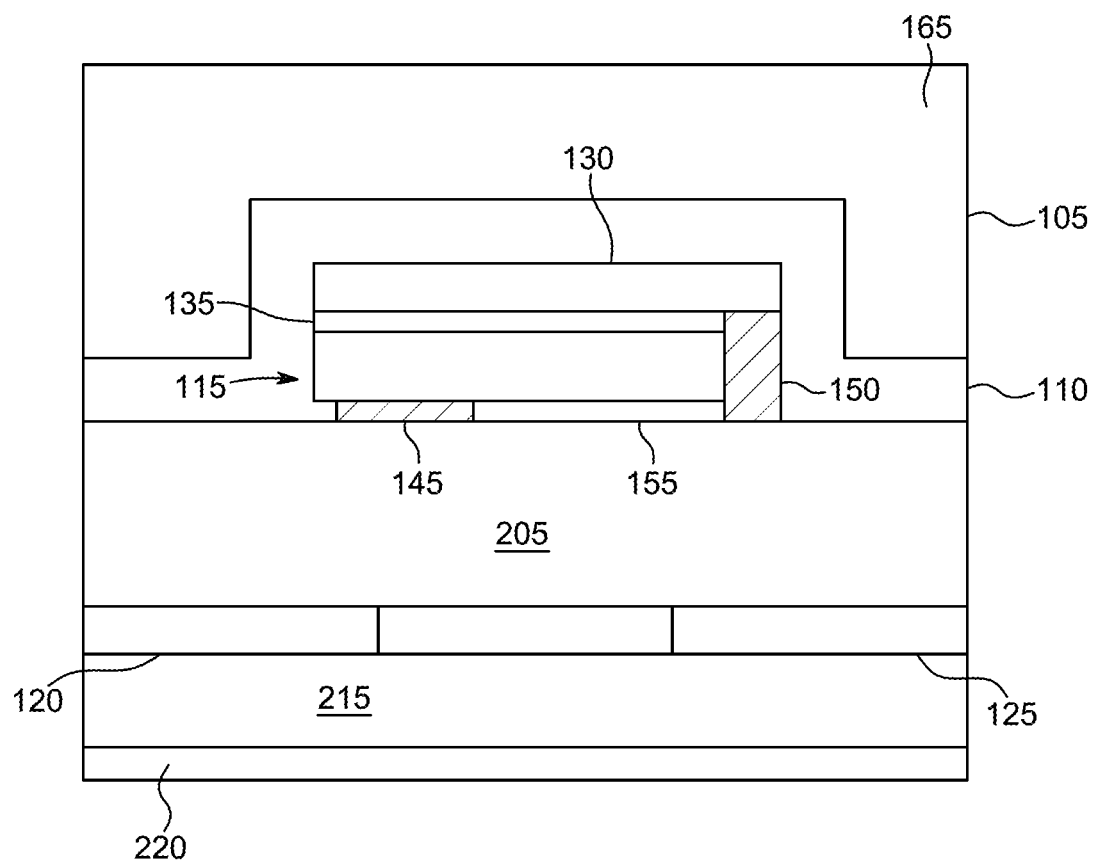
FIG. 2A is a diagram of an example light emitting device (LED) that may include the LEE of FIG. 1A.

FIG. 2A is a diagram of an example light emitting device (LED) 200A. In the example illustrated in FIG. 2A, the LED 200A includes the light emitting semiconductor structure 115 of FIG. 1B, which is mounted to a submount 205 that includes the contacts 120 and 125. The light emitting semiconductor structure 115 may be mounted to the submount 205 by an electrical coupling between the contacts 145 and 150 on the light emitting semiconductor structure 115 and submount electrodes on an adjacent surface of the submount 205 (not shown in FIG. 2A). The submount electrodes may be electrically connected by vias (not shown) to the contacts 120 and 125 on the opposite surface of the submount 205. In embodiments, the LED 200A may be mounted to a printed circuit board (PCB) 215. In such embodiments, the submount 205 may be mounted via the contacts 120 and 125 to the PCB 215. Metal traces on the circuit board may electrically couple the contacts 120 and 125 to a power supply, such that an operational or drive voltage and current may be applied to the LED when it is desired to turn the LED on.

The submount 205 may be formed from any suitable material, such as ceramic, Si, or aluminum. If the submount material is conductive, an insulating material may be disposed over the substrate material, and the metal electrode pattern may be formed over the insulating material. The submount 205 may act as a mechanical support, provide an electrical interface between the n and p electrodes on the LED chip and a power supply, and provide heat sinking. In embodiments, a heat sink may alternatively or additionally be provided on the PCB 215, such as a metal core PCB-MCPCB heat sink 220 illustrated in FIG. 2A. While the heat sink 220 is illustrated in FIG. 2A as being attached to the bottom of the PCB 215, one of ordinary skill in the art will recognize that other arrangements are possible without departing from the scope of the embodiments described herein.

In the example LED 200A, the wavelength converting material 110 completely surrounds the light emitting semiconductor structure 115 on all surfaces except the surface that electrically connects the light emitting semiconductor structure 115 to the submount 205. The optional coating 105 may be disposed in direct contact with the wavelength converting material 110. The coating may not be a separate layer, may be a coating on the individual phosphor particles or may be formed on the ceramic phosphor, and this coating may include pores. These pores may be filled with a binder or matrix material and may be part of the wavelength converter 110. Coatings of phosphor materials are described in U.S. patent application Ser. No. 15/802,273, which was filed on Nov. 2, 2017 and is incorporated by reference herein in its entirety. Phosphor coatings of sol-gel, atomic layer deposition (ALD), evaporation, sputtering, dip and dry, or spin coating methods include SiO2, Al2O3, HfO2, Ta2O5, ZrO2, TiO2, Y2O3, and Nb2O5. Coatings may be thick enough to include pores that may be formed during or after deposition.

Figure 2B:
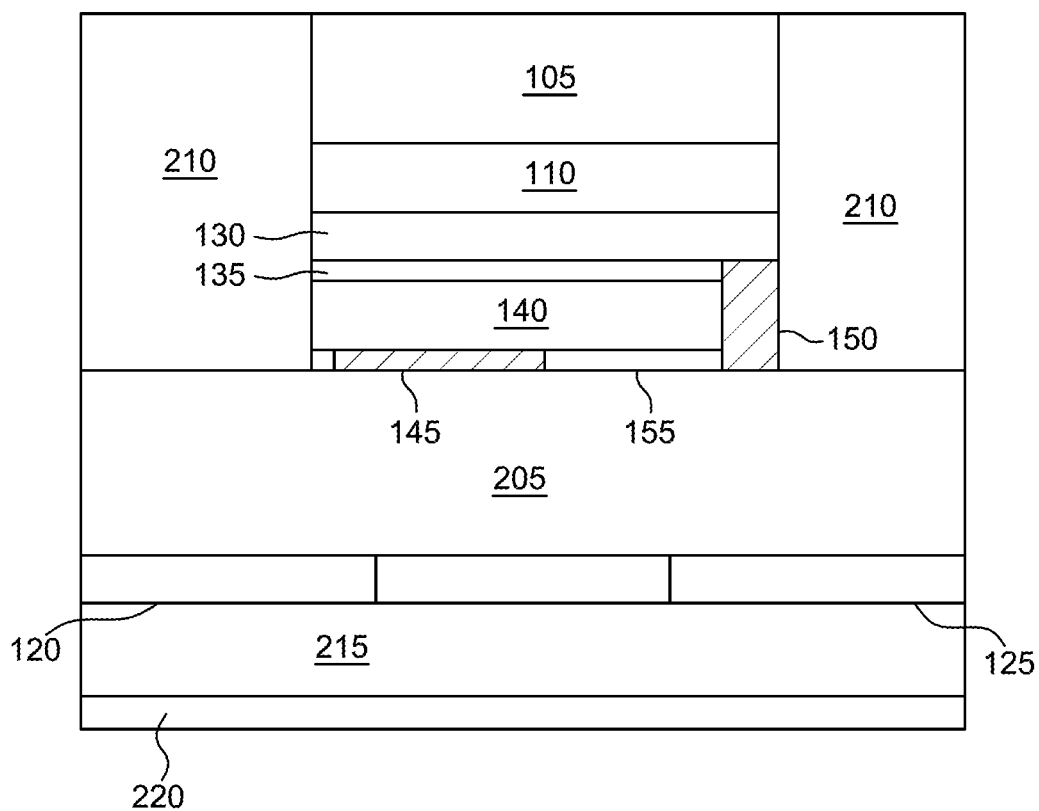
FIG. 2B is a diagram of another example LED that may include the LEE of FIG. 1A.

FIG. 2B is a diagram of another example LED 200B. In the example LED 200B, the wavelength converting material 110 is deposited on the light emitting semiconductor structure 115. An optional coating 105 may be disposed in direct contact with the wavelength converting material 110. A structure 210, such as a frame, is disposed adjacent side surfaces of a stack formed by the light emitting semiconductor structure 115, the wavelength converting material 110 and the optional coating 105 and may surround the stack. The entire structure 210, but at least inner surfaces of the structure 210 that are adjacent the stack, may be formed from or coated in a light reflecting material, such as an interference layer or a strongly scattering layer, to further minimize absorption of any scattered light.

Figure 3:
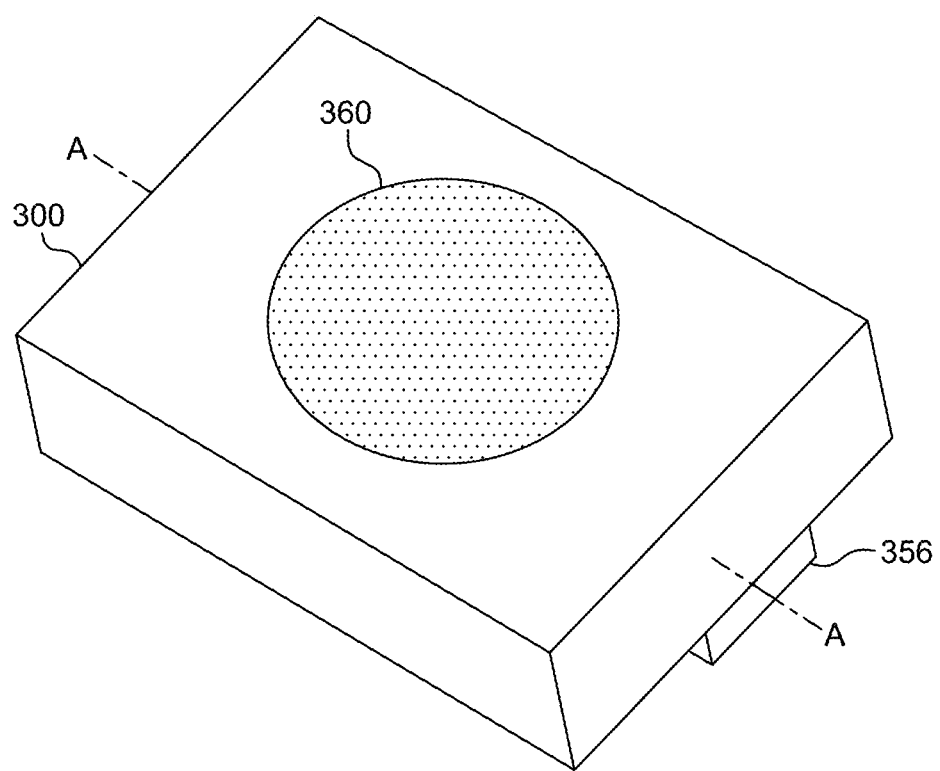
FIG. 3 is a schematic perspective view of a light emitting device which includes a wavelength-converting element that is formed by using a phosphor combination belonging to a warm-white phosphor system, according to aspects of the disclosure.
Figure 4:
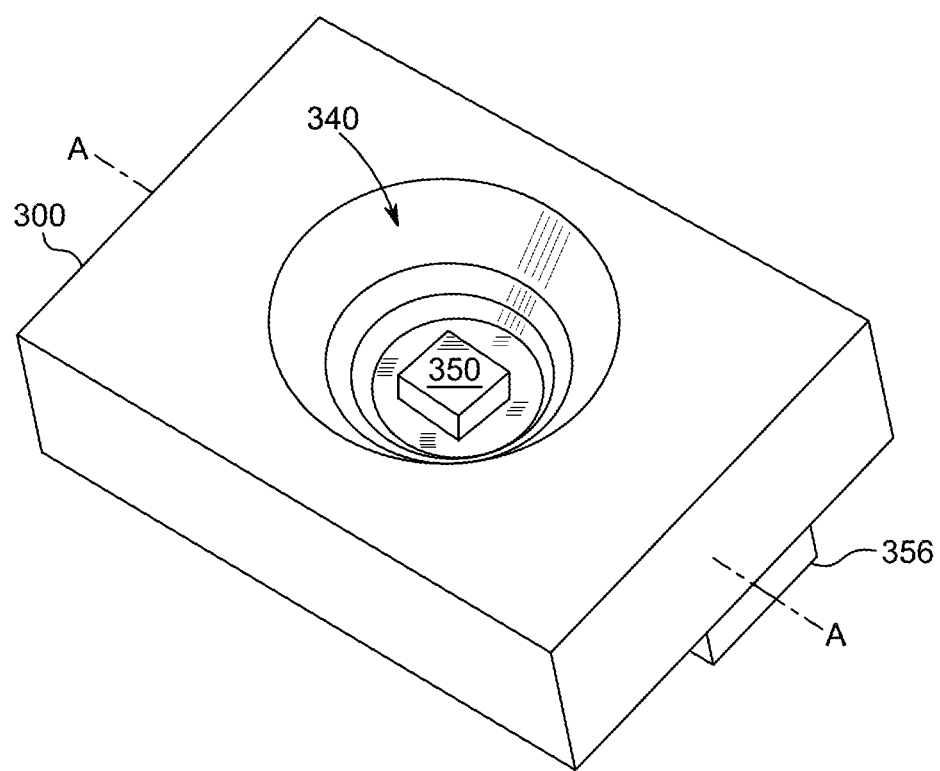
FIG. 4 is a schematic perspective view of the light emitting device of FIG. 3 with the wavelength-converting element removed to reveal components situated underneath the wavelength-converting element, according to aspects of the disclosure.
Figure 5:
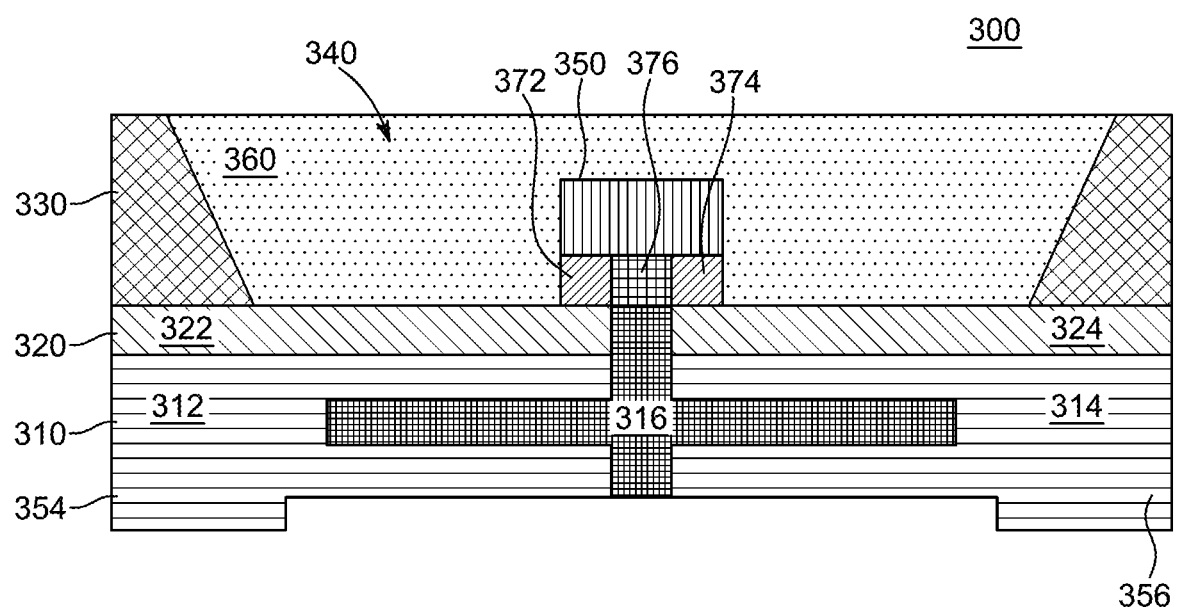
FIG. 5 is a cross-sectional side view of the light emitting device of FIG. 3, according to aspects of the disclosure.

FIG. 3 is a schematic perspective view of a device 300 that is light emitting and which includes a wavelength-converting element 360, which may be the same as or similar to wavelength converting material 110 of FIG. 1, formed using the warm-white phosphor system discussed above. FIG. 4 is a schematic perspective view of the device 300 with the wavelength-converting element 360 removed to expose a light source 350, which is situated underneath it. FIG. 5 is a schematic cross-sectional view of the light emitting device 300.

As illustrated in FIGS. 3-5, the device 300 includes a base 310 comprising a first electrically conductive lead frame 312 that is coupled to a second electrically conductive lead frame 314 by an electrically non-conductive element 316. A reflective layer 320 is formed over the base 310, and a sidewall 330 is formed above the reflective layer 320 to define a reflector cup 340. The reflective layer 320 may have a first portion 322 and a second portion 324. The first portion 322 and the second portion 324 of the reflective layer 320 may be electrically insulated from one another by the non-conductive element 316. Contacts 354 and 356 may be integrally formed on the bottom surfaces of the lead frames 312 and 314 to provide means for connecting the device 300 to various types of electronic circuitry. Lead frame 312 may be coupled to a contact pad 372 of the light source 350 and the lead frame 314 may be coupled to a contact pad 374 of the light source 350. A non-conductive underfill element 376 may be formed between the contact pads 372 and 374 to further bolster the bond between the light source 350 and the base 310.

The light source 350 may be disposed in the reflector cup 340, as shown. The light source 350 may be the primary emission source of the device 300. In some implementations, the light source 350 may be an LED configured to emit blue light. In some implementations, the wavelength of the blue light emitted by the light source 350 may be in the range of 400-550 nm (or 400-530 nm). However, it will be understood that the present disclosure is not limited to any particular blue light spectrum, as blue LEDs produced by different manufacturers may have differing blue light emission spectra.

The wavelength-converting element 360 may be formed by suspending a phosphor combination belonging to the warm-white phosphor system (e.g., a combination of a green phosphor material and a red phosphor material) into a silicone slurry (or another matrix material) to form an encapsulating compound, which is injected into the reflector cup 340 to seal the light source 350 inside. According to an implementation, suspending a phosphor combination, belonging to the warm-white phosphor system, in a matrix material, may form the wavelength-converting element 360. According to an alternative implementation, using one or more alternative techniques may form the wavelength-converting element 360. For example, the phosphor combination may be sintered to produce a tile that is then disposed on or above the light emitting surface of the light source 350. As another example, the phosphor combination may be applied on a substrate (e.g., a glass tile), which is then disposed on or above the light emitting surface of the light source 350. As yet another example, the phosphor combination may be used to form a coating which is then applied on the sides of the reflector cup 340 and/or one or more surfaces of an overlying optical element. As yet another example, the phosphor combination may be used to form a film which is subsequently laminated onto a surface of the light source 350 and/or a surface of the device 300. As yet another example, the green phosphor and the red phosphor that make the phosphor combination may be applied in separate layers above the light source 350. Stated succinctly, the present disclosure is not limited to any specific technique for using the warm-white phosphor system to convert primary (blue) light emitted by the light source 350 to secondary (warm-white) light.

As disclosed herein, a warm-white phosphor system may be arranged to produce warm-white light having CCT between 1600K and 2500K and may include a green phosphor and a red phosphor. The green phosphor may have a peak emission wavelength that is greater than 530 nm. And the red phosphor may have a peak emission wavelength that is less than 620 nm. In some implementations, the warm-white phosphor system may have an excitation range between 380 nm and 530 nm. Additionally or alternatively, in some implementations, the warm-white phosphor system may have a peak emission wavelength between 580 nm and 620 nm (e.g., around 600 nm).

The green phosphor may be any suitable type of green phosphor. Additionally or alternatively, in some implementations, the green phosphor may be any suitable type of YAG phosphor. Additionally or alternatively, in some implementations, the green phosphor may include any suitable type of phosphor having a peak emission wavelength between 535 nm and 560 nm. Additionally or alternatively, the green phosphor may include any suitable type of green phosphor having an excitation range between 400 nm and 480 nm. For example, in some implementations, the green phosphor may be a NYAG4355 phosphor, which is marketed and sold by Intematix Corporation of Fremont, Calif., USA. In such instances, the green phosphor may be a Ce doped YAG phosphor having density of 4.8 g/cm and particle size of 13.5 μm. Furthermore, in such instances, the peak emission wavelength of the green phosphor may be 551 nm and its excitation range may be between 430 nm and 490 nm.

The red phosphor may be any suitable type of red phosphor. Additionally or alternatively, in some implementations, the red phosphor may be any suitable type of BSSNE phosphor (e.g., a $(BS)_2S_8N_5:E$ phosphor). Additionally or alternatively, the red phosphor may include any suitable type of phosphor having peak emission wavelength between 580 nm and 620 nm. Additionally or alternatively, the red phosphor may include any suitable type of red phosphor having an excitation range between 350 nm and 580 nm. In some implementations, the red phosphor may be a (Ba,Sr)AlSiN3:Eu phosphor with a Ba:Sr ratio of 1:1 and an Eu concentration of 1%. Further information about red BSSNE phosphors that can be used in the warm-white phosphor system can be found in U.S. patent application Ser. No. 13/988,852, which is herein incorporated by reference.

In some implementations, the green-to-red phosphor weight ratio of the warm-white phosphor system may be between 1.5 and 0.64. As used throughout the present disclosure, the term "green-to-red phosphor weight ratio" refers to the ratio of the weight of green phosphor to the weight of red phosphor in a particular phosphor combination belonging to the warm-white phosphor system. When phosphors combinations belonging the warm-white phosphor system are suspended in a silicone slurry, the phosphor-to-silicone weight ratio of the resulting compound may be between 0.6 and 0.7. As used throughout the present disclosure, the term "phosphor-to-silicone weight ratio," in the context of mixing a phosphor combination with a silicon slurry, refers to the ratio of the weight of the phosphor combination (e.g., a combination of green and red phosphors) and the weight of the silicone.

In some implementations, the green-to-red phosphor weight ratio of the warm-white phosphor system may be approximately 1.6. Additionally or alternatively, in some implementations, the green-to-red phosphor weight ratio of the warm-white phosphor system may be approximately 1.01. Additionally or alternatively, in some implementations, the green-to-red phosphor weight ratio of the warm-white phosphor system may be approximately 0.67.

Figure 6:
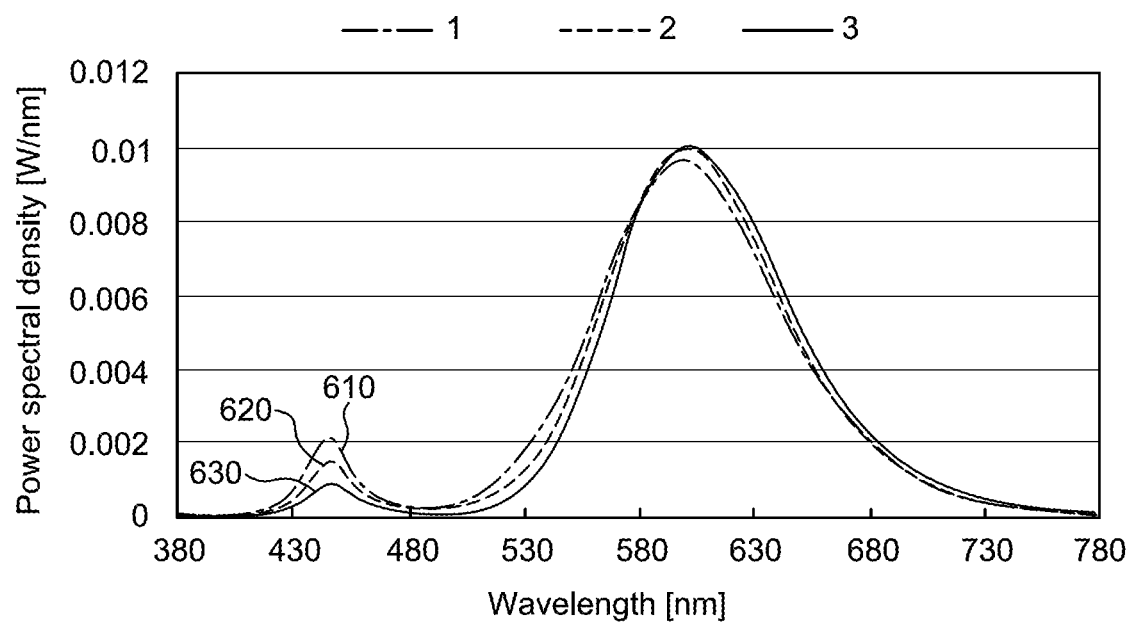
FIG. 6 is a plot illustrating the emission spectra that can be produced by different phosphor combinations belonging to the warm-white phosphor system, according to aspects of the disclosure.

FIG. 6 is a spectral plot illustrating how varying the green-to-red phosphor ratio may affect the performance of the warm-white phosphor system. More specifically, FIG. 6 includes a plot showing the emission spectra of three different phosphor combinations that belong to the warm-white phosphor system. These phosphor combinations are herein referred to as first phosphor combination, second phosphor combination, and third phosphor combination. All three combinations are formed by mixing a red phosphor and a green phosphor in a silicon slurry. More particularly, the green-to-red phosphor weight ratio of the first phosphor combination may be 1.6 and its phosphor-to-silicon weight ratio may be 0.623. The green-to-red phosphor weight ratio of the second phosphor combination may be 1.01 and its phosphor-to-silicon weight ratio may be 0.638. The green-to-red phosphor weight ratio of the third phosphor combination may be 0.64 and its phosphor-to-silicon weight ratio may be 0.677.

As illustrated in FIG. 6, curve 610 represents the power spectral density (W/nm) of the first phosphor combination. Curve 620 represents the power spectral density (W/nm) of the second phosphor combination. Curve 630 represents the power spectral density (W/nm) of the third phosphor combination. In the example of FIG. 6, the first, second, and third combinations may be formed using a green phosphor having a peak emission wavelength of 541 nm and a red phosphor having a peak emission wavelength of 604 nm. As can be readily appreciated, the first, second, and third phosphor combinations are provided as an example only. Accordingly, the present disclosure is not limited in any way to the examples discussed with respect to FIG. 6.

Figure 7:
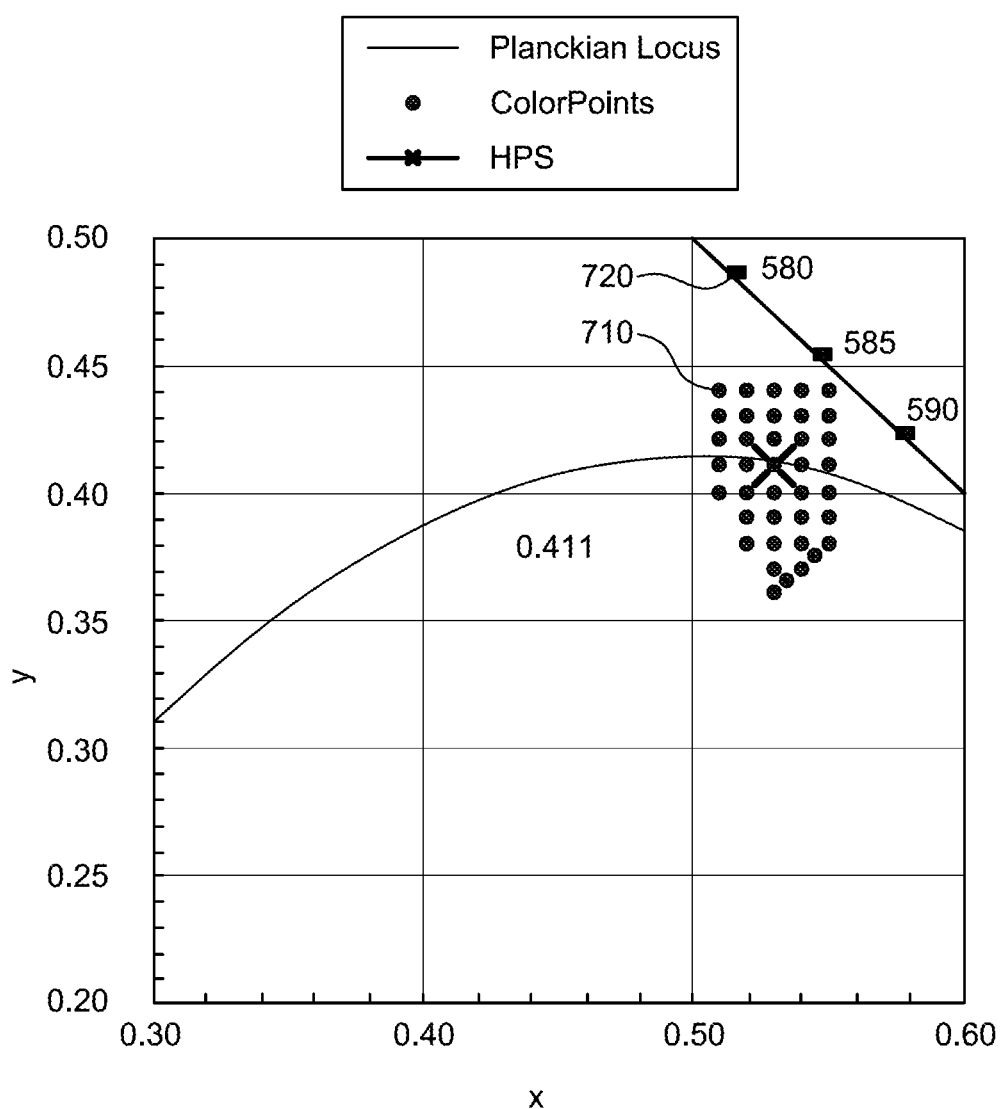
FIG. 7 is a plot illustrating the color rendering performance of the warm-white phosphor system, according to aspects of the disclosure.

FIG. 7 is a plot illustrating the color of different emissions that can be produced by the warm-white phosphor system. More particularly, FIG. 7 is a CIE1931 chromaticity diagram illustrating different color points that can be achieved by respective phosphor combinations belonging to the warm-white phosphor system. Each of the points 710 indicates the color (in the CIE1931 color space) of light emissions produced by a particular phosphor combination belonging to the warm-white phosphor system, as disclosed herein. Points 720 indicate the color points of monochromatic light on the spectral locus for the listed wavelength in nm. With the color point of the light source and a reference white color point (e.g., CIE-D65) these wavelengths on the outer boundary can define the dominant wavelength of a spectral distribution.

Figure 8A:
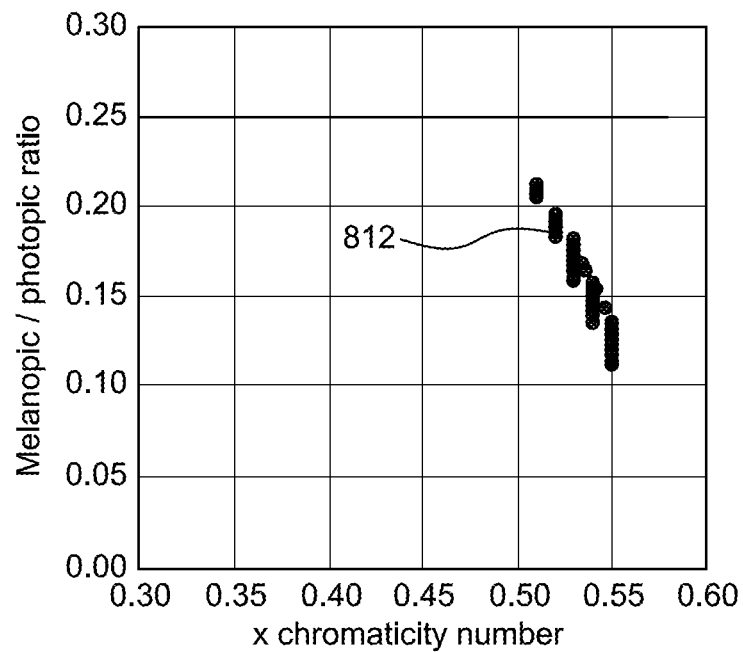
FIG. 8A is a plot illustrating the amount of blue light content in emissions produced by the warm-white phosphor system, according to aspects of the disclosure.
Figure 8B:
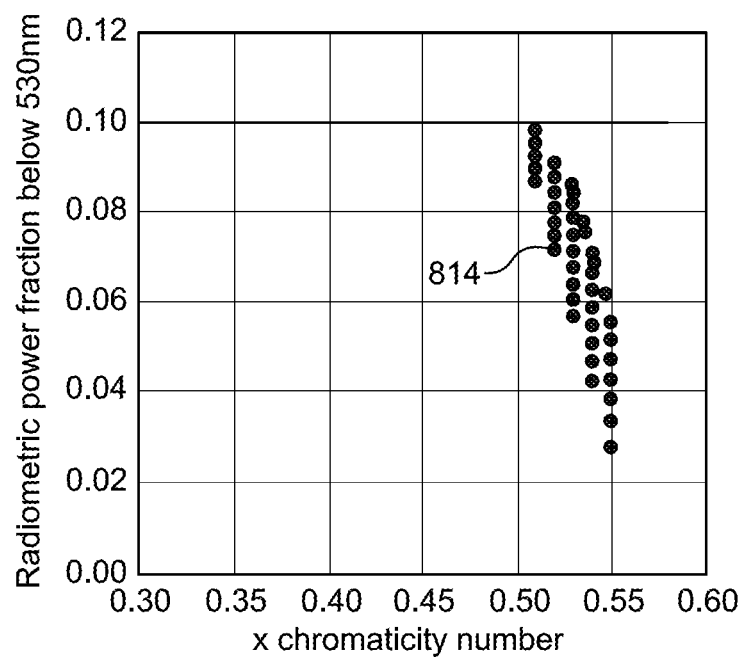
FIG. 8B is a plot illustrating the amount of blue light content in emissions produced by the warm-white phosphor system, according to aspects of the disclosure.

FIGS. 8A and 8B are plots illustrating the blue light content in emissions produced by the warm-white phosphor system disclosed herein. More particularly, FIG. 8A is a plot having an x-axis and a y-axis where the y-axis of the plot represents melanopic/photopic ratio ranging from 0.00 to 0.30. and the x-axis represents the x-coordinates in the CIE1931 color space, and it can range from 0.30 to 0.60. The points 612 represent the respective melanopic/photopic ratio for different colors of light that can be produced by respective phosphor combinations belonging to the warm-white phosphor system. As illustrated, the melanopic/photopic ratio of all light emissions is below 0.25

FIG. 8B is a plot illustrating the radiometric fraction of light of wavelength below 530 nm (e.g., blue light) for different light emissions that can be produced by the warm-white phosphor system disclosed herein. The y-axis of the plot represents radiometric power fraction values ranging from 0.00 to 0.12. The x-axis represents the x-coordinates in the CIE1931 color space, and it can range from 0.30 to 0.60. The points 614 represent the radiometric power fraction of light having a wavelength below 530 nm in different colors of light emissions that can be produced by respective phosphor combinations belonging to the warm-white phosphor system. As illustrated, the radiometric power fraction of light having a wavelength below 530 nm in each of the emissions is below 0.1.

Figure 8C:
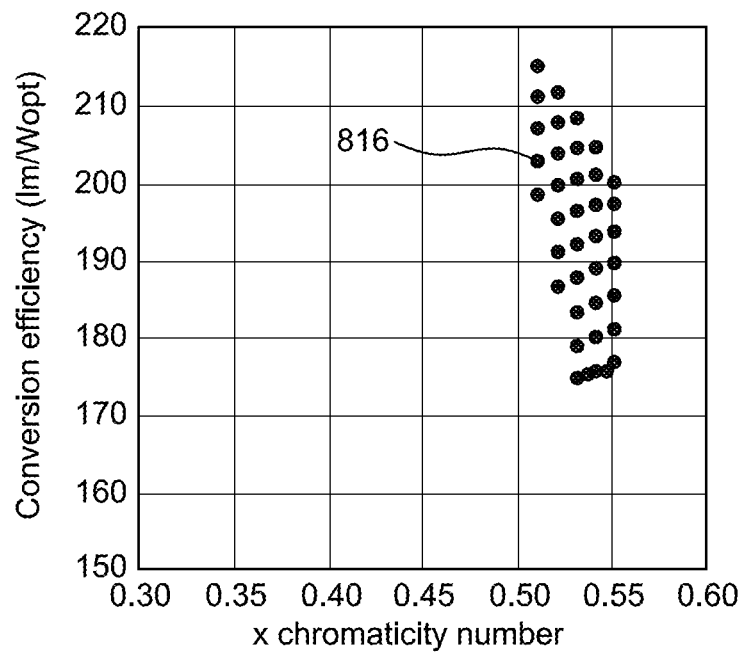
FIG. 8C is a plot illustrating the conversion efficiency of emissions produced by the warm-white phosphor system, according to aspects of the disclosure.

FIG. 8C illustrates the conversion efficiency of the warm-white phosphor system disclosed herein. The plot includes an x-axis and a y-axis. The y-axis of the plot represents conversion efficiency ranging from 150 lm/W to 220 lm/W. The x-axis represents the x-coordinates in the CIE1931 color space, and can range from 0.30 to 0.60. The points 616 represent the conversion efficiency for different colors of light that can be produced by respective phosphor combinations belonging to the warm-white phosphor system. As illustrated, the conversion efficiency of the light emissions that can be produced by the warm-white phosphor system is between 170 lm/W and 220 lm/W.

Figure 8D:
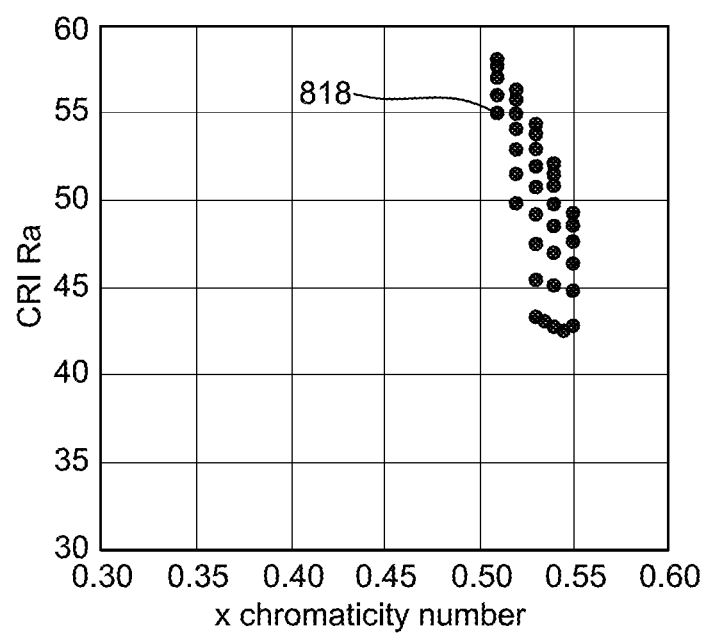
FIG. 8D is a plot illustrating the CRI of emissions produced by the warm-white phosphor system, according to aspects of the disclosure.

FIG. 8D illustrates the CRI of different emissions that can be produced by the warm-white phosphor system disclosed herein. The plot includes an x-axis and a y-axis. The y-axis represents color rendering index (CRI) Ra. The x-axis represents the x-coordinates in the CIE1931 color space, and it can range from 0.30 to 0.60. The points 618 represent the CRI Ra values for different colors of light that can be produced by respective phosphor combinations belonging to the warm-white phosphor system. As illustrated, the CRI Ra value for the light emissions varies between 40 and 60.

As can be seen from FIGS. 8A-D, the blue light content of emissions produced by the warm-white phosphor system disclosed herein is below the pre-defined limits of 0.25 malanopic/photopic ratio and 0.1 radiometric power fraction for light having a wavelength below 530 nm. The CRI Ra of emissions produced by the warm-white phosphor system disclosed herein is between 40 and 60. The modeled conversion efficiency (CE) of the warm-white phosphor system is around 200 lm/W.

As noted above, the wavelength-converting element 360 of the device 300 may be formed of a phosphor combination belonging to the warm-white phosphor system. With state-of-the-art wall-plug efficiency (WPE) of the device 300 at about 65%, the overall efficacy of the device 300 in this spectrum is estimated to be in the 130-135 lm/W range.

Table 1 below compares the power efficiency of one implementation of the device 300 to that of an example 100 W HPS light source:

TABLE 1

Comparison of Power Efficiency of
Device 100 and an HPS Light Source

| | HPS 100 W | Device 300 |
|---|---|---|
| Source efficacy (lm/W) | 95 lm/W | 133 lm/W |
| Ballast/driver efficiency | 85% | 85% |

TABLE 1-continued

Comparison of Power Efficiency of
Device 100 and an HPS Light Source

|  | HPS 100 W | Device 300 |
| --- | --- | --- |
| Optical efficiency | 70% | 88% |
| Luminaire efficacy (lm/W) | 57 lm/W | 100 lm/W |

Table 1 illustrates that the device 300 can provide a significant performance improvement over traditional HPS light sources. Specifically, Table 1 shows that the luminaire-level efficiency improvement presented by the device 300 may be approximately 75% in a typical roadway light. Furthermore, the light use efficiency of LED systems is higher than HSP light sources due to the smaller source size affording better optical control. Therefore, the gain in "delivered" lumens per Watt can be even higher in typical applications.

Table 2 below compares the color rendering performance of one implementation of the device 300 to that of an example 100 W HPS light source. More particularly, Table 2 compares the CCT, CRI, color fidelity (TM-30 Rf), and color gamut (TM-30 Rg) of the example HPS light source and the device 300. The color gamut and color fidelity are measured in accordance with the TM-30 system. TM-30 is a system of measures and graphics that can be used to evaluate and communicate light sources' color rendering property.

TABLE 2

Comparison of Power Efficiency of
Device 100 and an HPS Light Source

|  | HPS 100 W | LED |
| --- | --- | --- |
| CCT (K) | 1971 K | 1944 K |
| CRI Ra | 17 | 51 |
| TM-30 Rf | 32 | 51 |
| TM-30 Rg | 61 | 86 |

Table 2 illustrates that the device 300 can provide a significant performance improvement over comparable HPS light sources. More particularly, the device 300 may have a considerably better color fidelity (TM-30 Rf) and color gamut (TM-30 Rg) than traditional HPS light sources due to the improved rendering of greens and reds. This, in turn, may increase color visibility in outdoor applications, such as vehicle and traffic sign recognition, and improve overall user perception.

Figure 9A:
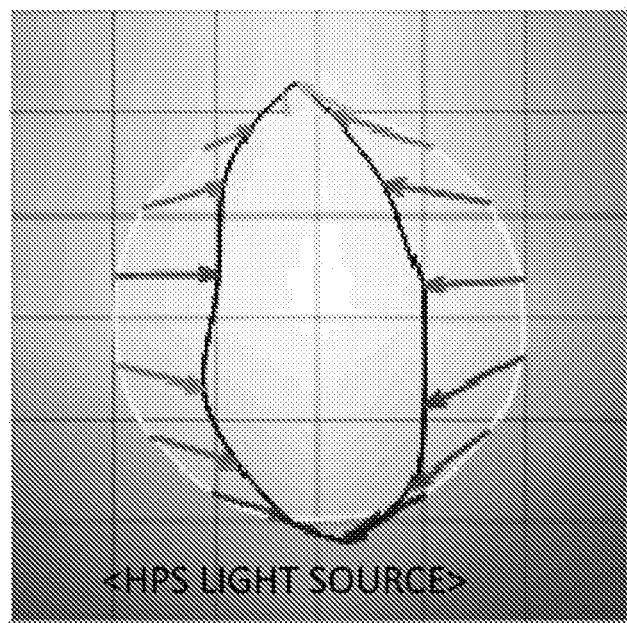
FIG. 9A is a TM-30 color vector plot illustrating the color rendering performance of an HPS light source, according to aspects of the disclosure; and And FIG. 9B is a TM-30 color vector plot illustrating the color rendering performance of the device of FIG. 3, according to aspects of the disclosure.
Figure 9B:
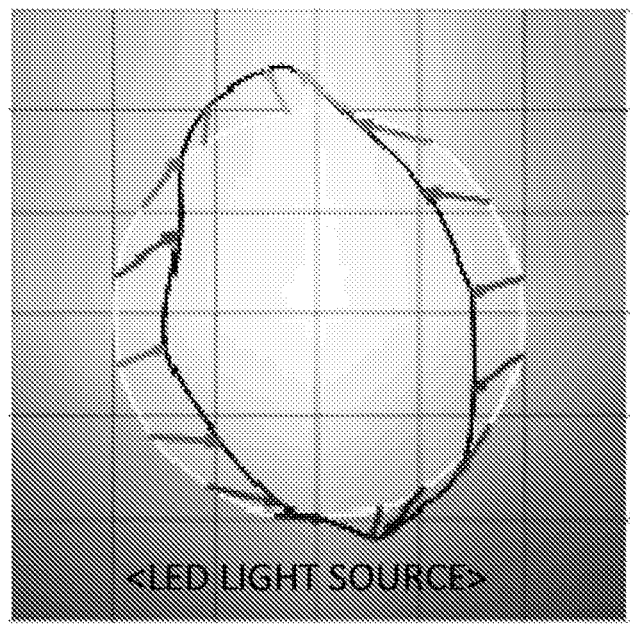

The data provided in Table 2 is expressed graphically in FIGS. 9A-B. FIG. 9A is a TM-30 color vector plot showing the color rendering performance of the HPS light source. And FIG. 9B is a color vector plot showing the color rendering performance of the device 300. As illustrated in FIGS. 9A-B and Table 2, both the HPS light source and the device 300 produce light emissions of similar respective color temperatures (1917K and 1944K, respectively). However, the device 300 may have a higher CRI, color fidelity (TM-30 Rf), and color gamut (TM-30 Rg).

Although the present disclosure is provided in the context of outdoor lighting applications, it will be understood that the above-described warm-white phosphor system can be utilized in any lighting context, including, but not limited to indoor lighting, horticulture lighting, decorative lighting, etc. Although in the present example, the device 300 is a mid-power LED, the present disclosure is not limited to any particular type of LED. Furthermore, the present disclosure is not limited to any specific type of LED package. For example, the above-described warm-white phosphor system may be used in chip-scale packages and/or any other suitable type of LED package.

FIGS. 1-9B are provided as an example only. At least some of the elements discussed with respect to these figures can be arranged in different order, combined, and/or altogether omitted. It will be understood the phrase "phosphor combination belonging to the warm-white phosphor system" refers to a particular species of the genus represented by the above-described warm-white phosphor system. It will be understood that the provision of the examples described herein, as well as clauses phrased as "such as," "e.g.", "including", "in some aspects," "in some implementations," and the like should not be interpreted as limiting the disclosed subject matter to the specific examples.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is being claimed is:

1. A light emitting device, comprising:
an emission source configured to emit a primary blue light; and
a wavelength-converting element comprising a red phosphor material having a peak emission wavelength that is less than 620 nm and a green phosphor material having a peak emission wavelength that is greater than 530 nm, the wavelength-converting element configured to convert the primary blue light to a secondary light;
the light emitting device configured to emit a white light comprising the primary blue light and the secondary light, the white light having a correlated color temperature (CCT) between 1600K and 2500K and a melanopic/photopic ratio less than 0.25.

2. The light emitting device of claim 1, wherein the red phosphor has a peak emission wavelength of approximately 604 nm, and the green phosphor has a peak emission wavelength of approximately 543 nm.

3. The light emitting device of claim 1, wherein the emission source comprises at least one light emitting diode.

4. The light emitting device of claim 1, wherein the peak emission wavelength of the green phosphor material is approximately in a range 530-560 nm and the peak emission wavelength of the red phosphor material is approximately in a range of 580-620 nm.

5. The light emitting device of claim 1, wherein the wavelength-converting element has a green-to-red phosphor weight ratio of approximately 1.6.

6. The light emitting device of claim 1, wherein the wavelength-converting element has a green-to-red phosphor weight ratio of approximately 1.01.

7. The light emitting device of claim 1, wherein the wavelength-converting element has a green-to-red phosphor weight ratio of approximately 0.64.

8. The light emitting device of claim 1, wherein the red phosphor material and the green phosphor material are suspended in a silicone matrix, and the wavelength-converting element has a phosphor-to-silicon mass ratio in the range of 0.62-0.68.

9. The light emitting device of claim 1, wherein the white light has a color rendering index (CRI) in a range of 40-60.

10. A light emitting device, comprising:
- an emission source configured to emit a primary blue light; and
- a wavelength-converting element comprising a red phosphor material having a peak emission wavelength that is less than 620 nm and a green phosphor material having a peak emission wavelength that is greater than 530 nm, the wavelength-converting element configured to convert the primary blue light to a secondary light;
- the light emitting device configured to emit a white light comprising the primary blue light and the secondary light, the white light having a correlated color temperature (CCT) between 1600K and 2500K and a radiometric power fraction of light having a wavelength below 530 nm below 0.1.

11. The light emitting device of claim 10, wherein the red phosphor has a peak emission wavelength of approximately 604 nm, and the green phosphor has a peak emission wavelength of approximately 543 nm.

12. The light emitting device of claim 10, wherein the emission source comprises at least one light emitting diode.

13. The light emitting device of claim 10, wherein the peak emission wavelength of the green phosphor material is approximately in a range 530-560 nm and the peak emission wavelength of the red phosphor material is approximately in a range of 580-620 nm.

14. The light emitting device of claim 10, wherein the wavelength-converting element has a green-to-red phosphor weight ratio of approximately 1.6.

15. The light emitting device of claim 10, wherein the wavelength-converting element has a green-to-red phosphor weight ratio of approximately 1.01.

16. The light emitting device of claim 10, wherein the wavelength-converting element has a green-to-red phosphor weight ratio of approximately 0.64.

17. The light emitting device of claim 10, wherein the secondary light has a color rendering index (CRI) in a range of 40-60.

18. The light emitting device of claim 10, wherein the red phosphor material and the green phosphor material are suspended in a silicone matrix, and the wavelength-converting element has a phosphor-to-silicon mass ratio in the range of 0.62-0.68.

19. The light emitting device of claim 10, wherein the red phosphor material comprises a BSSNE phosphor.

20. The light emitting device of claim 10, wherein the green phosphor material comprises a YAG phosphor.

* * * * *